United States Patent
Modarres-Zadeh et al.

(10) Patent No.: US 11,088,672 B2
(45) Date of Patent: Aug. 10, 2021

(54) BULK ACOUSTIC WAVE RESONATORS WITH SHAPED BORDER RINGS

(71) Applicant: Qorvo US, Inc., Greensboro, NC (US)

(72) Inventors: Mohammad J. Modarres-Zadeh, Longwood, FL (US); Alireza Tajic, Snoqualmie, WA (US); Paul Stokes, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 44 days.

(21) Appl. No.: 16/525,865

(22) Filed: Jul. 30, 2019

(65) Prior Publication Data
US 2020/0235718 A1 Jul. 23, 2020

Related U.S. Application Data

(60) Provisional application No. 62/794,599, filed on Jan. 19, 2019.

(51) Int. Cl.
| | |
|---|---|
| *H03H 9/54* | (2006.01) |
| *H03H 9/02* | (2006.01) |
| *H03H 9/17* | (2006.01) |

(52) U.S. Cl.
CPC .......... *H03H 9/54* (2013.01); *H03H 9/02007* (2013.01); *H03H 9/17* (2013.01); *H03H 2009/02173* (2013.01)

(58) Field of Classification Search
CPC ................... H03H 9/54–589; H03H 9/17–175
See application file for complete search history.

(56) References Cited

U.S. PATENT DOCUMENTS

| | | | | |
|---|---|---|---|---|
| 7,952,257 | B2 * | 5/2011 | Iwaki | H03H 9/02118 310/320 |
| 8,791,776 | B2 * | 7/2014 | Pang | H03H 9/02086 333/187 |
| 8,854,156 | B2 * | 10/2014 | Iwashita | H03H 3/02 333/187 |
| 10,547,283 | B2 * | 1/2020 | Tajic | H03H 9/175 |
| 2017/0244021 | A1 * | 8/2017 | Han | H01L 41/0475 |

(Continued)

OTHER PUBLICATIONS

Nguyen, et al., "A Design Approach for High-Q FBARs With a Dual-Step Frame", IEEE Transactions on Ultrasonics, Ferroelectrics, and Frequency Control, vol. 65, Issue 9, Sep. 2018, 9 pages.

(Continued)

*Primary Examiner* — Dean O Takaoka
*Assistant Examiner* — Alan Wong
(74) *Attorney, Agent, or Firm* — Withrow & Terranova, P.L.L.C.

(57) ABSTRACT

Bulk acoustic wave (BAW) resonators, and particularly shaped border (BO) rings for BAW resonators are disclosed. Top electrode arrangements are disclosed that include a BO ring arranged about a periphery of a top electrode, where the BO ring forms a top surface having a shape that is sloped or graded in comparison to planar surfaces of the top electrode. The top surface of the BO ring may be arranged such that a height of the top surface is graded in a descending manner toward a central region of the BAW resonator. BAW resonators as disclosed herein are provided with high quality factors and suppression of spurious modes while also providing reduced acoustic leakage and mode conversion.

25 Claims, 11 Drawing Sheets

(56) References Cited

U.S. PATENT DOCUMENTS

2017/0263844 A1* 9/2017 Tajic ...................... H03H 9/175
2020/0099359 A1* 3/2020 Shin ......................... H03F 1/56

OTHER PUBLICATIONS

Thalhammer, et al., "Finite Element Analysis of BAW Devices: Principles and Perspectives", International Ultrasonics Symposium, Taipei, Taiwan, Oct. 2015, 10 pages.

* cited by examiner

BULK ACOUSTIC WAVE RESONATORS WITH SHAPED BORDER RINGS

RELATED APPLICATIONS

This application claims the benefit of provisional patent application Ser. No. 62/794,599, filed Jan. 19, 2019, the disclosure of which is hereby incorporated herein by reference in its entirety.

FIELD OF THE DISCLOSURE

The present disclosure relates to bulk acoustic wave (BAW) resonators, and particularly to shaped border rings for BAW resonators.

BACKGROUND

Acoustic resonators and, particularly, bulk acoustic wave (BAW) resonators are used in many high-frequency, communication applications. In particular, BAW resonators are often employed in filter networks that operate at frequencies above 1.5 gigahertz (GHz) and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

The present disclosure relates to bulk acoustic wave (BAW) resonators, and particularly to shaped border (BO) rings for BAW resonators. BAW resonators as disclosed herein include a piezoelectric layer that is arranged between top and bottom electrodes. Top electrode arrangements are disclosed that include a BO ring arranged about a periphery of a top electrode. In certain embodiments, the BO ring forms a top surface having a shape that is sloped or graded in comparison to planar surfaces of the top electrode. The top surface of the BO ring may be arranged such that a height of the top surface is graded in a descending manner toward a central region of the BAW resonator. BAW resonators as disclosed herein are provided with high quality factors and suppression of spurious modes while also providing reduced acoustic leakage and mode conversion.

In one aspect, a BAW resonator comprises: a bottom electrode; a piezoelectric layer over the bottom electrode; and a top electrode over the piezoelectric layer, the top electrode forming a BO ring that extends about a periphery of a central region of the top electrode, and a top surface of the BO ring forms a height from the piezoelectric layer that is graded in a descending manner from a lateral edge of the BO ring toward the central region. In certain embodiments, an active region is formed where the top electrode overlaps with the bottom electrode on opposing faces of the piezoelectric layer, an outside region is formed outside of the active region, and the lateral edge of the BO ring is arranged closer to the outside region than other portions of the BO ring. In certain embodiments, the height of the top surface of the BO ring is continuously graded from the lateral edge of the BO ring toward the central region. In certain embodiments, the top surface of the BO ring forms an angle of at least 165 degrees from a top surface of the top electrode in the central region. In certain embodiments, the top surface of the BO ring forms an angle in a range including 165 degrees to 175 degrees from a top surface of the top electrode in the central region. In certain embodiments, a height of the lateral edge of the BO ring is in a range including 200 nanometers to 400 nanometers. A cross-section of the BO ring may form a triangular shape. In certain embodiments, the BO ring forms a raised frame about a periphery of the top electrode. In certain embodiments, the BO ring is an integral continuous portion of the top electrode. In certain embodiments, the bottom electrode comprises a larger lateral dimension along the piezoelectric layer than the top electrode. In certain embodiments, the top electrode forms an inner ring that is a mass-reducing region of the top electrode. The inner ring may be spaced apart from the BO ring by a gap portion of the top electrode. In certain embodiments, the BAW resonator comprises a solidly mounted resonator (SMR) type BAW resonator or a film bulk acoustic resonator (FBAR).

In another aspect, a BAW resonator comprises: a bottom electrode; a piezoelectric layer over the bottom electrode; a top electrode over the piezoelectric layer; and a BO ring that extends about a periphery of a central region of the top electrode, and a top surface of the BO ring forms a height from the piezoelectric layer that is graded in a descending manner from a lateral edge of the BO ring toward the central region. In certain embodiments, the BO ring comprises an additional material formed on the top electrode. The additional material may comprise a same material as the top electrode or a different material than the top electrode. In certain embodiments, the BO ring forms a raised frame about a periphery of the top electrode. In certain embodiments, the height of the top surface of the BO ring is continuously graded from the lateral edge of the BO ring toward the central region. In certain embodiments, the bottom electrode comprises a larger lateral dimension along the piezoelectric layer than the top electrode. In certain embodiments, the top electrode forms an inner ring that is a mass-reducing region of the top electrode. The inner ring may be spaced apart from the BO ring by a gap portion of the top electrode. In certain embodiments, the BAW resonator comprises a SMR type BAW resonator or a FBAR.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
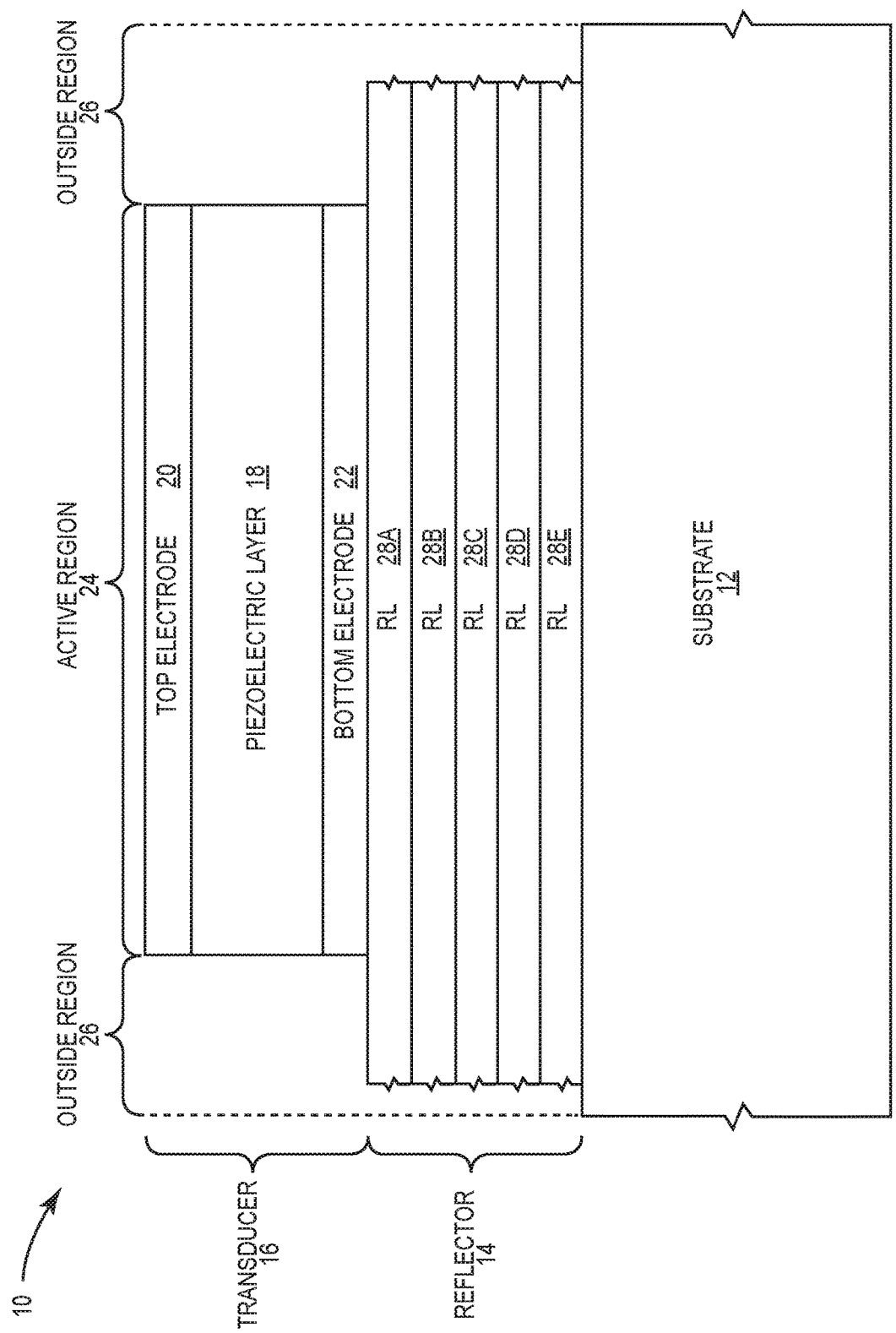
FIG. 1 is a diagram illustrating a conventional bulk acoustic wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to bulk acoustic wave (BAW) resonators, and particularly to shaped border (BO) rings for BAW resonators. BAW resonators as disclosed herein include a piezoelectric layer that is arranged between top and bottom electrodes. Top electrode arrangements are disclosed that include a BO ring arranged about a periphery of a top electrode. In certain embodiments, the BO ring forms a top surface having a shape that is sloped or graded in comparison to planar surfaces of the top electrode. The top surface of the BO ring may be arranged such that a height of the top surface is graded in a descending manner toward a central region of the BAW resonator. BAW resonators as disclosed herein are provided with high quality factors and suppression of spurious modes while also providing reduced acoustic leakage and mode conversion.

Prior to delving into the details of these concepts, an overview of BAW resonators and filters that employ BAW resonators is provided. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20, 22 may be formed of tungsten (W), molybdenum (Mo), platinum (Pt), or like material, and the piezoelectric layer 18 may be formed of aluminum nitride (AlN), zinc oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20, 22 overlap (e.g., vertically overlap) and also includes the layers below the overlapping top and bottom electrodes 20, 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by an air-metal boundary at a top surface of the top electrode 20. Acoustic waves traveling downwardly are reflected back into the transducer 16 by the reflector 14, or by an air cavity, which is provided just below the transducer 16 in a film bulk acoustic resonator (FBAR).

The reflector 14 is typically formed by a stack of reflector layers (RL) 28A through 28E (referred to generally as reflector layers 28), which alternate in material composition to produce a significant reflection coefficient at the junction of adjacent reflector layers 28. Typically, the reflector layers 28 alternate between materials having high and low acoustic impedances, such as tungsten (W) and silicon dioxide (SiO$_2$). While only five reflector layers 28 are illustrated in FIG. 1, the number of reflector layers 28 and the structure of the reflector 14 will vary from one design to another.

Figure 2:
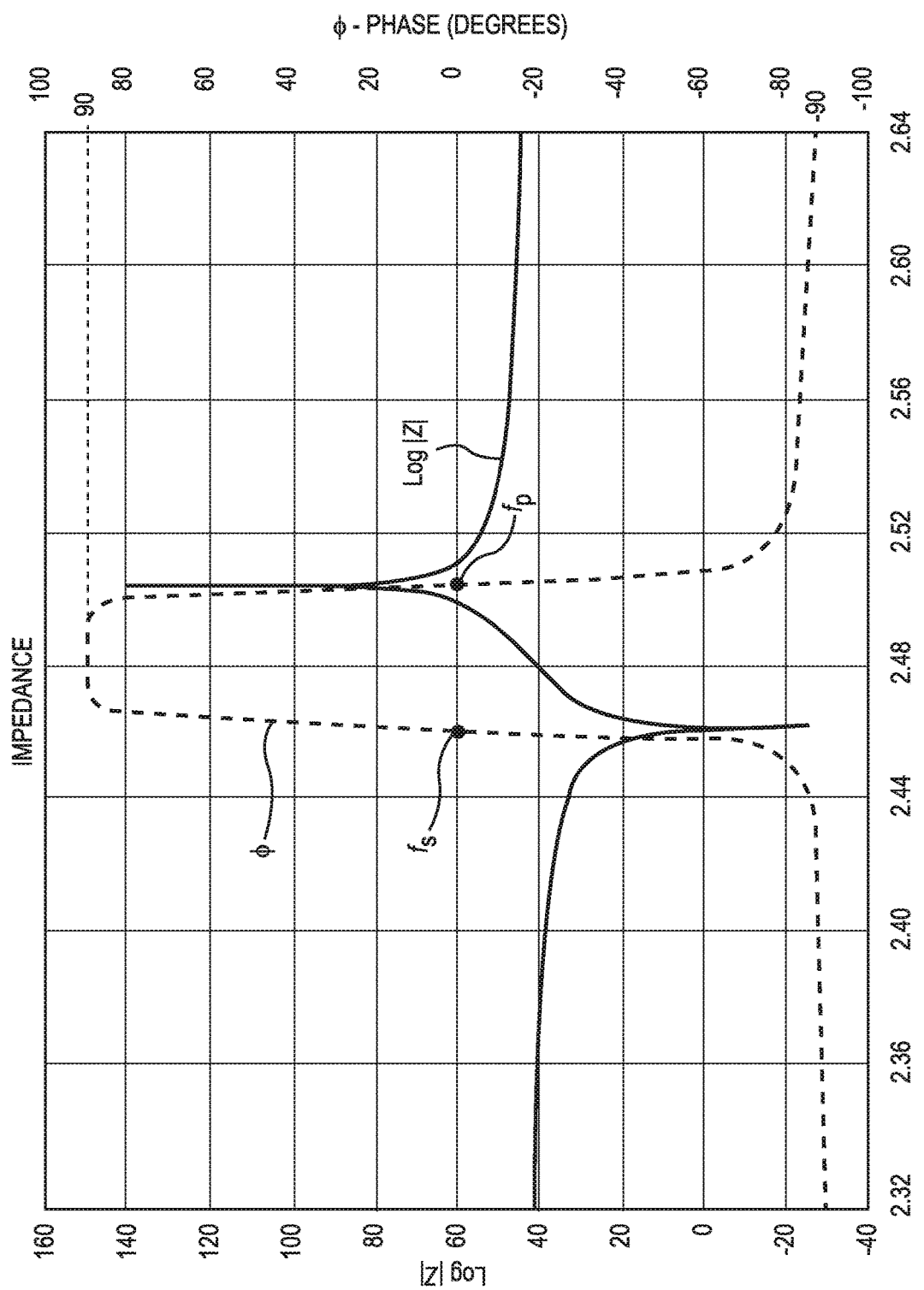
FIG. 2 is a diagram graphically illustrating the magnitude and phase of the electrical impedance as a function of the frequency for a relatively ideal BAW resonator.

The magnitude (Z) and phase (φ) of the electrical impedance as a function of the frequency (GHz) for a relatively ideal BAW resonator 10 is provided in FIG. 2. The magnitude (Z) of the electrical impedance is illustrated by the solid line, while the phase (φ) of the electrical impedance is illustrated by the dashed line. A unique feature of the BAW resonator 10 is that it has both a resonance frequency and an antiresonance frequency. The resonance frequency is typically referred to as the series resonance frequency ($f_s$), and the antiresonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness or height of the piezoelectric layer 18 and the mass of the bottom and top electrodes 20, 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$), and a very high resistance at the parallel resonance frequency ($f_p$). The electrical nature of the BAW resonator 10 lends itself to the realization of a very high quality factor (Q) inductance over a relatively short range of frequencies, which has proven to be very beneficial in high frequency filter networks, especially those operating at frequencies around 1.8 GHz and above.

Figure 3:
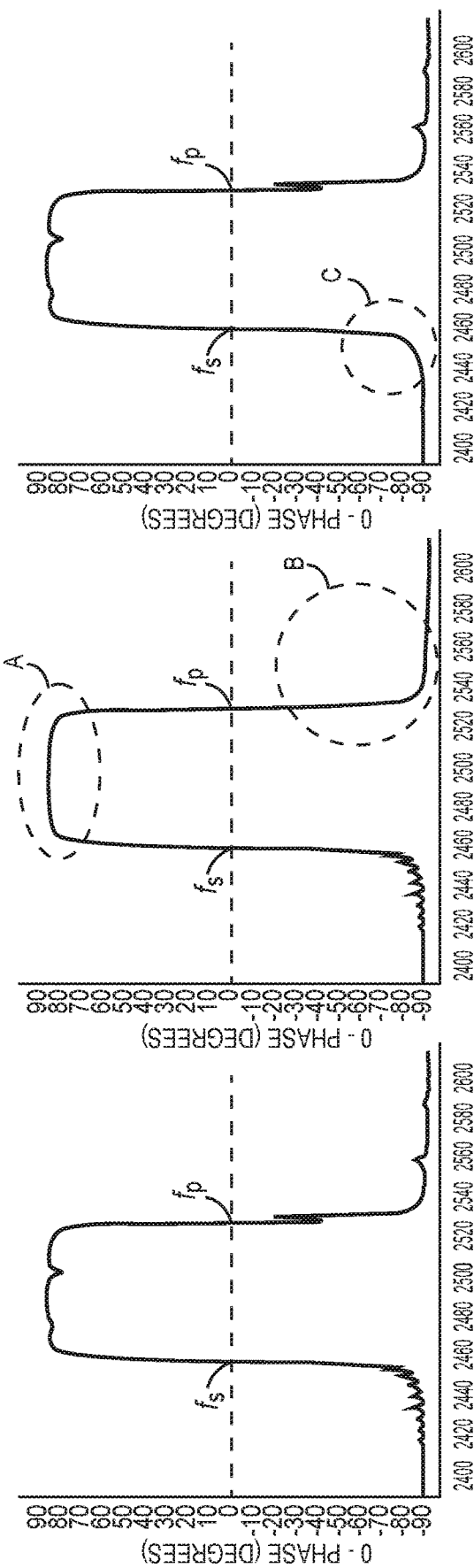
FIGS. 3A-3C are diagrams graphically illustrating phase curves for various conventional BAW resonators.

Unfortunately, the phase (φ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes a ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential quality factor (Q) associated with the BAW resonator 10.

Figure 4:
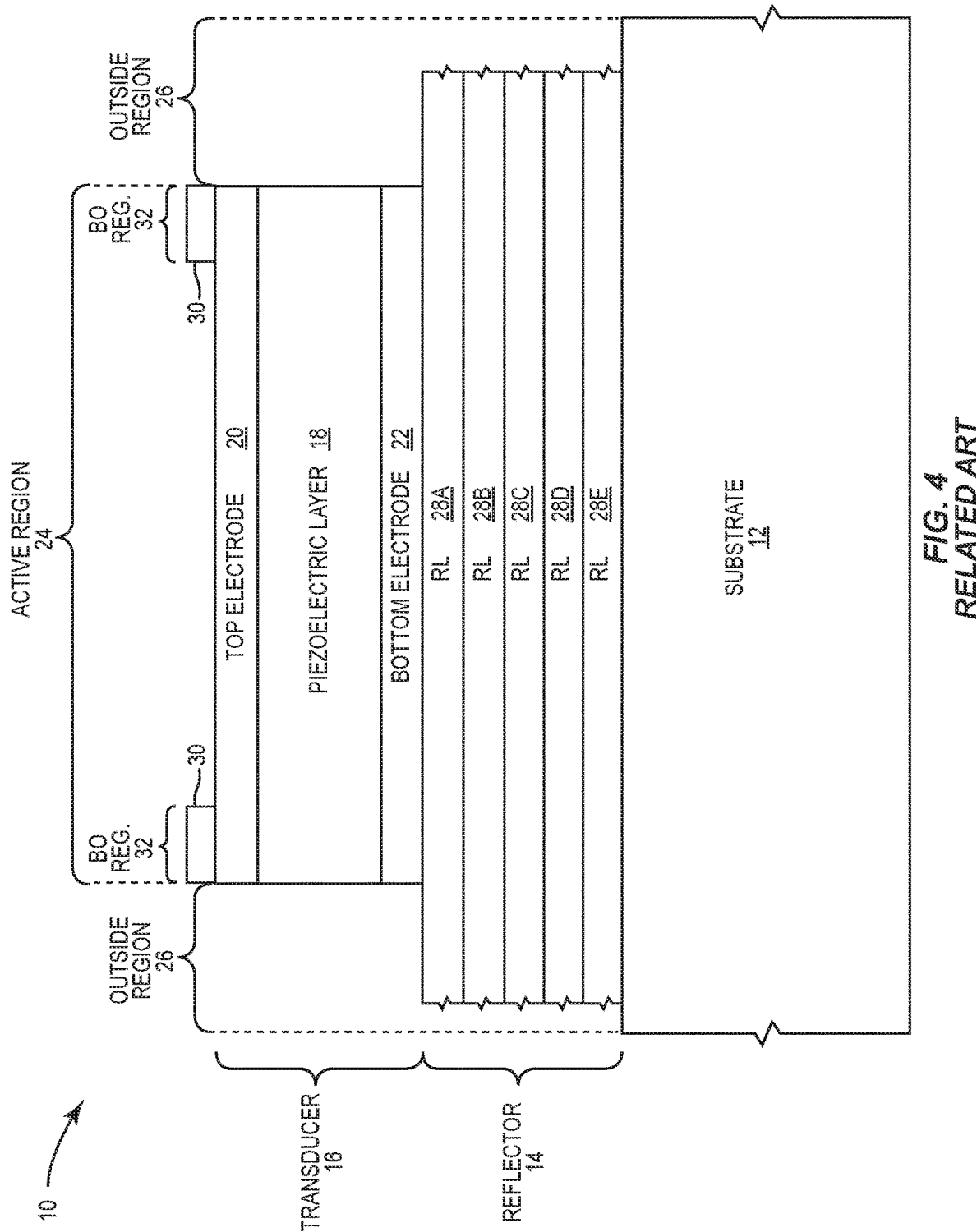
FIG. 4 is a diagram illustrating a conventional BAW resonator with a top electrode including a border (BO) ring.

As illustrated in FIG. 4, a BO ring 30 is formed on or within the top electrode 20 to suppress certain ones of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus the spurious mode, in the passband of the phase curve, which resides between the series resonance frequency ($f_s$) and the parallel resonance frequency ($f_p$). Circle B shows suppression of the ripple, and thus the spurious modes, above the parallel resonance frequency ($f_p$). Notably, the spurious mode in the upper shoulder of the passband, which is just below the parallel resonance frequency ($f_p$), and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of a portion of the top electrode 20 that extends about a periphery of the active region 24. In this regard, the BO ring 30 with mass loading forms a raised frame that is arranged about a periphery of the top electrode 20. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown in FIG. 3B. A technique referred to as apodization is often used to suppress the spurious modes that fall below the series resonance frequency ($f_s$).

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed. Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

A thickness or height of the BO ring 30 may be measured in a direction perpendicular to or away from the piezoelectric layer 18 and a width of the BO ring 30 may be measured in a direction parallel to or laterally across the piezoelectric layer 18. The thickness and the width of the BO ring 30 may be concurrently tuned to provide suppression of spurious modes and to provide improvements to the quality factor at an antiresonance frequency ($Q_p$). The added mass associated with the BO ring 30 typically causes the BO region 32 to resonate at a slightly lower frequency than other portions of the active region 24. As a result, the presence of BO rings can introduce undesirable modes, or BO modes, at frequencies below the series resonance frequency ($f_s$).

Figure 5:
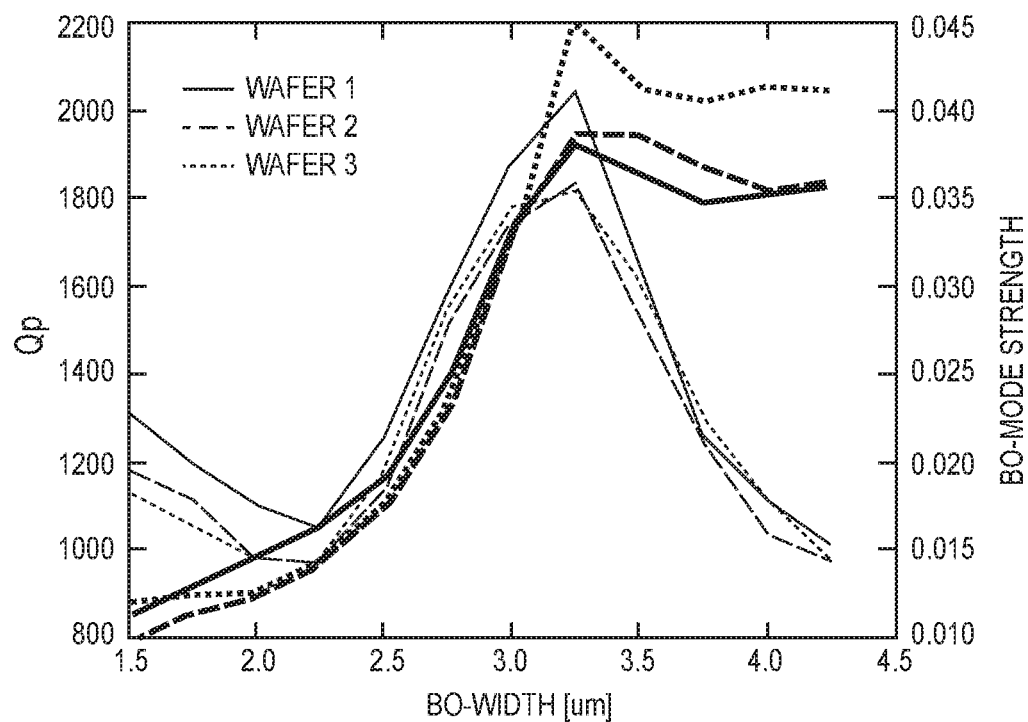
FIG. 5 is a diagram graphically illustrating the relationship of BO ring width to quality factor at an antiresonance frequency ($Q_p$) and the relative strength of BO modes formed.

FIG. 5 is a diagram graphically illustrating the relationship of BO ring width to quality factor at the antiresonance frequency ($Q_p$) and the relative strength of BO modes formed. In FIG. 5, the x-axis represents the BO ring width in microns (μm) while the primary y-axis represents the antiresonance frequency ($Q_p$) and the secondary y-axis represents relative strength or magnitude of the BO modes formed. The diagram of FIG. 5 plots data for three wafers that each included BAW resonators with varying BO ring widths. As shown, the $Q_p$ values generally increase with increasing BO ring widths and a highest $Q_p$ value corresponds to a BO ring width of just over 3 μm. As also shown, the BO mode strength also generally increases with increasing BO ring widths. For even higher BO ring widths, the $Q_p$ values decrease while the BO mode strength values remain high. In this manner, a BO ring that is tuned to provide a high $Q_p$ value may also introduce undesirable BO modes to the corresponding BAW device.

Figure 6:
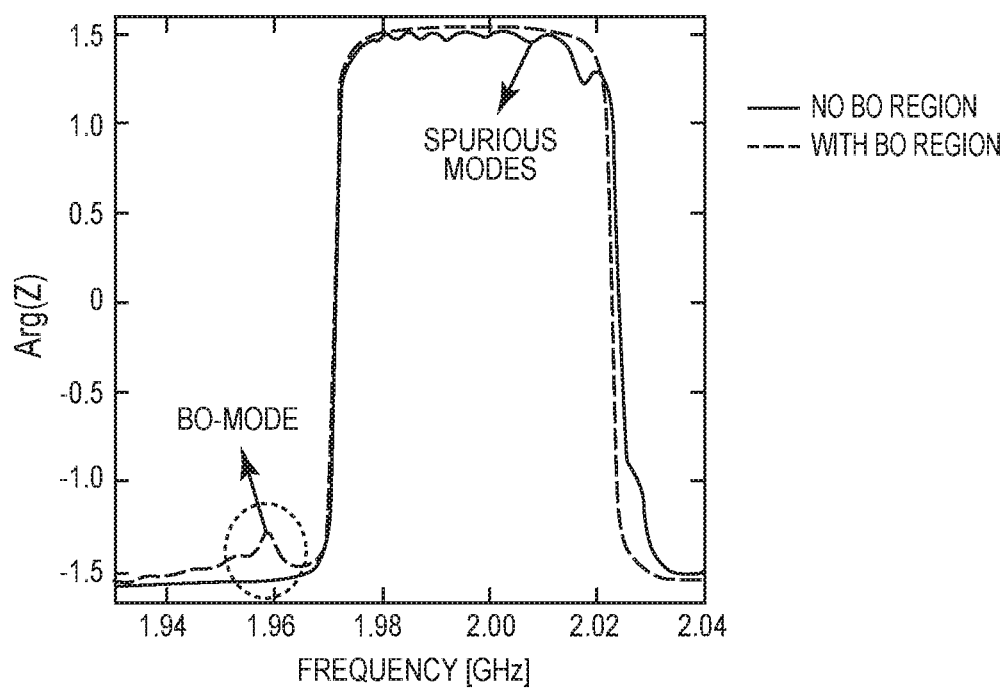
FIG. 6 is a diagram graphically illustrating phase curves for BAW resonators with and without BO rings.

FIG. 6 is a diagram graphically illustrating phase curves for BAW resonators with and without BO rings. As illustrated, spurious modes that are present within the passband of a BAW resonator without a BO ring are suppressed with the addition of a BO ring; however, the presence of the BO ring introduces undesirable BO modes below the passband. BO modes may be introduced outside or even inside the passband of the BAW resonator and may restrict the design or use of BAW resonators for wide bandwidth filtering applications. If the BO modes are within the passband, insertion loss can be impacted. BO modes that are present outside of the passband can be problematic for BAW multiplexing applications where BAW filters of different frequency bands operate at the same time. In such multiplexing applications, BO modes of one BAW filter can fall into the passband of other BAW filters and introduce interference during multiplexing.

Figure 7:
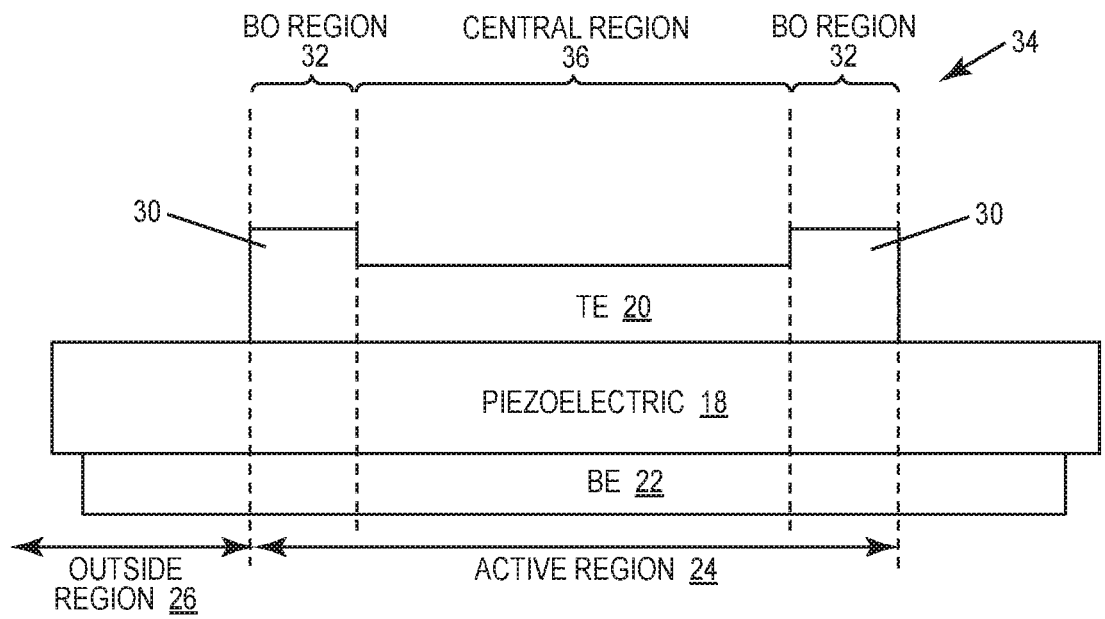
FIG. 7 is a cross-sectional diagram illustrating a BAW resonator where a BO region is arranged in a similar configuration to the BAW resonator of FIG. 4.

FIG. 7 is a cross-sectional diagram illustrating a BAW resonator 34 where the BO region 32 is arranged in a similar configuration to the BAW resonator 10 of FIG. 4. For illustrative purposes, FIG. 7 is a simplified view of the BAW resonator 34 and is not necessarily drawn to scale; however, it is understood the BAW resonator 34 may include many of the same components as the BAW resonator 10 of FIG. 4. As illustrated in FIG. 7, the BO region 32 is arranged about a periphery of the top electrode 20 and a central region 36 of the top electrode 20 is defined laterally inside of the BO region 32. The BO ring 30 is formed on or within the top electrode 20 to suppress certain ones of the spurious modes as described above for FIG. 4. In FIG. 7, the active region 24 is indicated as the section where the top electrode 20 and the bottom electrode 22 overlap on opposing sides of the piezoelectric layer 18. In this manner, the active region 24 generally corresponds to a portion of the piezoelectric layer 18 that is electrically driven such that an electric field is provided between overlapping portions of the top electrode 20 and the bottom electrode 22. The outside region 26 generally corresponds to the portion of the piezoelectric layer 18 that is outside of the active region 24 and in this regard, the outside region 26 is generally not electrically driven. In the configuration of FIG. 7, the BO region 32 and corresponding BO ring 30 are arranged within the active region 24. While beneficial for suppressing spurious modes above the series resonance frequency ($f_s$), the BO ring 30 can cause the BO region 32 to resonate at different frequencies than the active region 24, thereby introducing BO modes as illustrated in FIG. 6.

Figure 8:
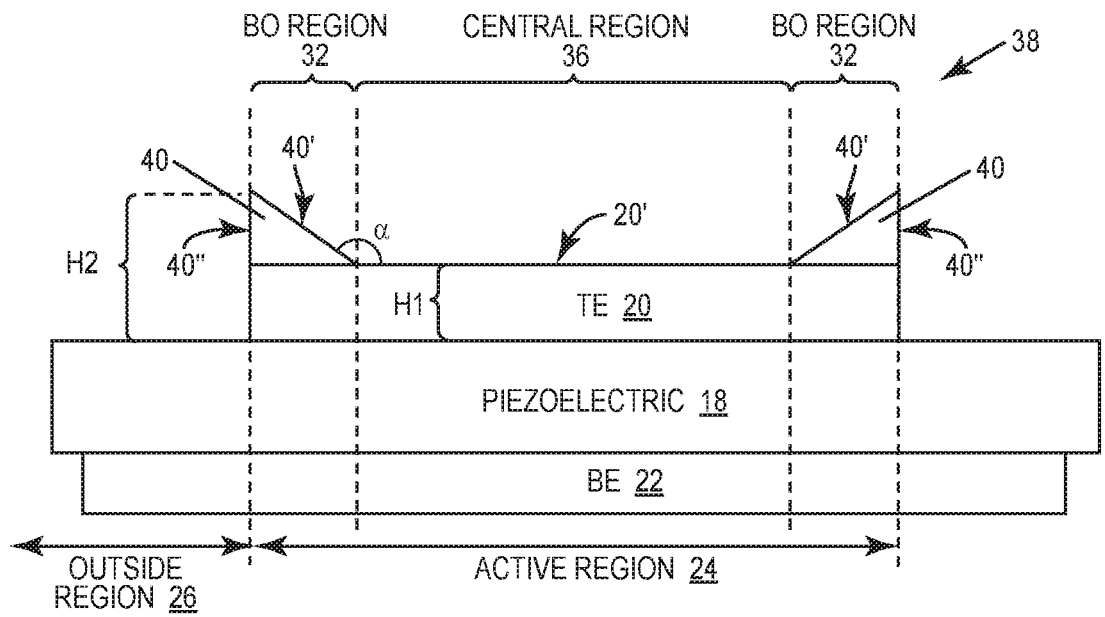
FIG. 8 is a cross-sectional diagram illustrating a BAW resonator that includes a BO ring with a top surface that is graded according to embodiments disclosed herein.

FIG. 8 is a cross-sectional diagram illustrating a BAW resonator 38 that includes a BO ring 40 with a top surface 40' that is graded according to embodiments disclosed herein. Dimensions of the BAW resonator 38 are not necessarily drawn to scale. The arrangement of the top electrode 20, the piezoelectric layer 18, and the bottom electrode 22 relative to one another forms the active region 24, the outside region 26, and the BO region 32. In particular, the active region 24 is formed or defined where the top electrode 20 overlaps (e.g., vertically aligned on opposite faces of the piezoelectric layer 18) with the bottom electrode 22 as indicated by the vertical dashed lines for the active region 24. The outside region 26 is thereby formed or defined as the area outside of the active region 24, and the BO region 32 is registered with the BO ring 40. In certain embodiments, portions of the bottom electrode 22 are arranged to extend into the outside region 26. By arranging the bottom electrode 22 with a larger lateral dimension along the piezoelectric layer 18 than the top electrode 20, alignment tolerances for placement of the top electrode 20 may be increased, thereby improving manufacturing tolerances and reducing misalignment of the top electrode 20 and the bottom electrode 22. The BO ring 40 is registered with the BO region 32, and the top surface 40' of the BO ring 40 is graded or sloped in a descending manner from a lateral edge 40" of the BO ring 40 toward the central region 36. As illustrated, the lateral edge 40" of the BO ring 40 is arranged adjacent to the outer region 26 such that the lateral edge 40" is closer to the outer region 26 than other portions of the BO ring 40. In particular, the central region 36 of the top electrode 20 forms a first height H1 from the piezoelectric layer 18, and the lateral edge 40" of the BO ring 40 forms a second height H2 from the piezoelectric layer 18 that is greater than the first height H1. In certain embodiments, a height of the top surface 40' of the BO ring 40 is arranged to grade with a descending slope from the second height H2 to the first height H1 within the BO region 32. In certain embodiments, the height of the top surface 40' of the BO ring 40 is arranged to continuously grade from the second height H2 to the first height H1. In further embodiments, the top surface 40' of the BO ring 40 is arranged to continuously grade from the second height H2 to the first height H1 in a linear manner. As illustrated, a cross-section of the BO ring 40 may form a triangular shape above the top electrode 20. In certain embodiments, the top surface 40' of the BO ring 40 grades or slopes to form an angle α relative to a generally planar top surface 20' of the top electrode 20 in the central region 36. In certain embodiments, the angle α is at least 165 degrees from the top surface 20' of the top electrode 20 in the central region 36. In certain embodiments, the angle α is in a range including 165 degrees to 175 degrees from the top surface 20' of the top electrode 20 in the central region 36. Dimensions of the BAW resonator 38 and the BO ring 40 may vary depending on a targeted operating frequency band. For example, for long term evolution (LTE) band 7 operation, the second height H2 of the BO ring 40 at the lateral edge 40" may comprise a range including 200 nanometers (nm) to 400 nm and a lateral width of the BO region 32 as measured from the outside region 26 to the active region 24 may comprise a range including 2 millimeters (mm) to 3 mm. By arranging the top surface 40' of the BO ring 40 in a graded or sloped manner, transitions from the active region 24 to the outside region 26 are provided with gradually increasing heights from the central region 36. In this manner, acoustic reflection to the active region 24, propagating acoustic modes registered with the outer region 26, and undesired acoustic scattering may be reduced. Accordingly, the BO ring 40 may be configured to provide reduced acoustic leakage and mode conversion at the BO region 32, thereby leading to improved performance of the BAW resonator 38. The BO ring 40 corresponds to a mass loading of a portion of the top electrode 20 that extends about a periphery of the active region 24. In this regard, the BO ring 40 with mass loading forms a raised frame that is arranged about a periphery, or the BO region 32, of the top electrode 20. The BO ring 40 may correspond to a thickened portion of the top electrode 20 such that the BO ring 40 is an integral continuous portion of the top electrode 20. In other embodiments, the BO ring 40 may include one or more additional layers or materials formed on the top electrode 20, where the one or more additional layers or materials may comprise the same material as the top electrode 20 or a different material from the top electrode 20. For example, the top electrode 20 may comprise at least one of W, Mo, Pt, or alloys thereof and the BO ring 40 may comprise the same material or at least one of W, Mo, Pt, or alloys thereof that is different than the material of the top electrode 20. The BO ring 40 may also comprise one or more other appropriate mass-loading materials.

Figure 9:
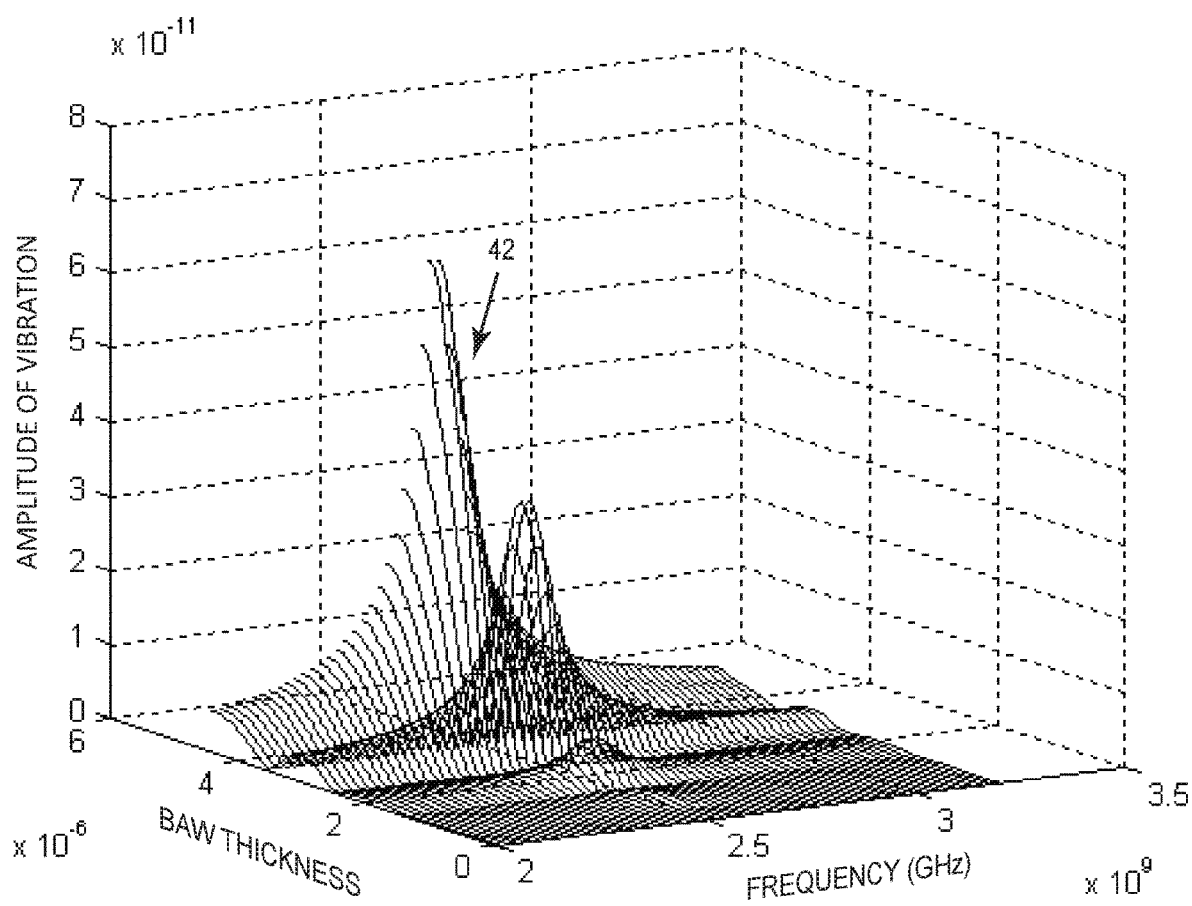
FIG. 9 is a plot illustrating how amplitude of vibration decreases by going away from a natural resonance frequency of a representative BAW resonator.

According to embodiments disclosed herein, the height of the BO ring at a thickest portion (e.g., the second height H2 in FIG. 8) may be configured to have a natural resonance frequency that is different than the active region of the BAW resonator. FIG. 9 is a plot illustrating how amplitude of vibration decreases by going away from a natural resonance frequency 42 of a representative BAW resonator. In FIG. 9, the x-axis represents frequency in GHz, the y-axis represents a thickness of an active region in meters ($10^{-6}$) for the representative BAW resonator, and the z-axis represents an amplitude of vibration. The representative BAW resonator is arranged as an SMR BAW resonator in a similar manner to FIG. 4. In this regard, a value of 0 on the y-axis represents a bottom of the reflector (14 of FIG. 4) or the interface between the substrate (12 of FIG. 4) and the reflector (14 of FIG. 4), and higher values, (e.g., 2, 4, etc.), on the y-axis represent a top of the top electrode (20 of FIG. 4) in the active region (24 of FIG. 4). As illustrated, the natural resonance frequency 42 of the active region occurs at about 2.6 GHz. Accordingly, for a BO ring with a sloped surface, the height at a thickest portion (e.g., the second height H2 in FIG. 8) and/or a material of the BO ring may be configured to provide a natural resonance frequency of the BO ring that is different that the natural resonance frequency 42 of the active region.

Figure 10A:
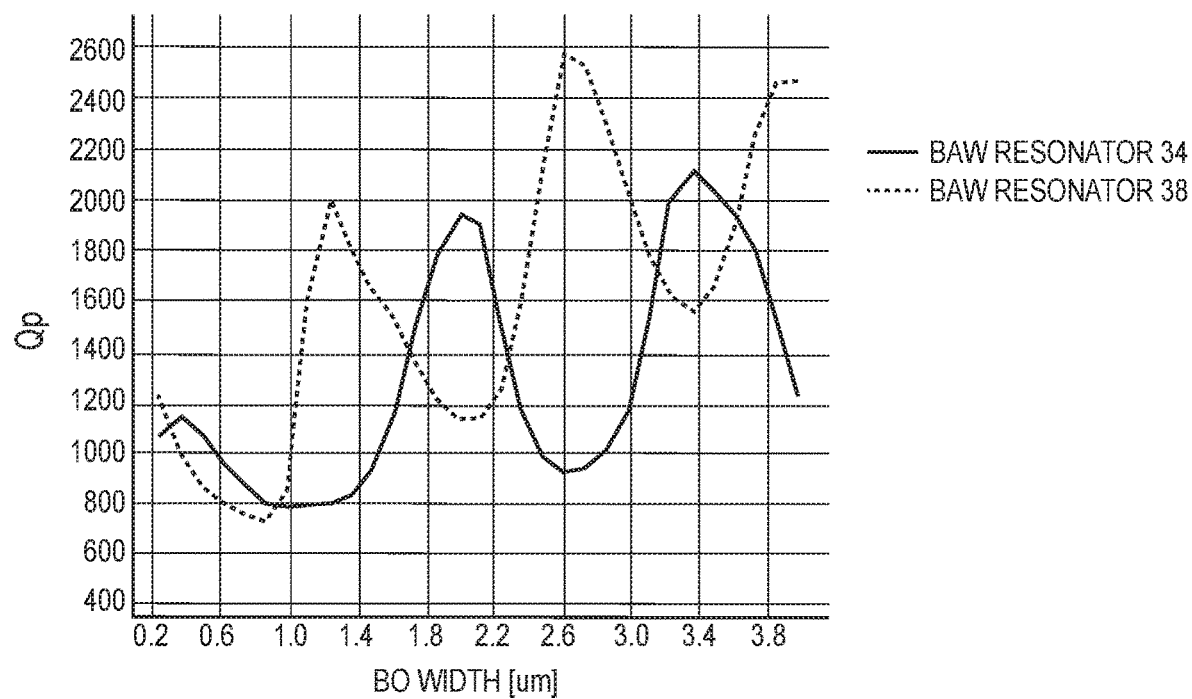
FIG. 10A is a diagram graphically illustrating a comparison of simulation results for $Q_p$ values of the BAW resonator of FIG. 8 and the BAW resonator of FIG. 7.

As disclosed herein, improvements to $Q_p$ values are demonstrated for various sloped or graded configurations of BO rings in BAW resonator structures. While $Q_p$ values are disclosed, the improvements are not just limited to $Q_p$ values as BAW resonator structures as disclosed herein may also demonstrate improved Q values for all operating frequencies above the main resonance frequency. FIG. 10A is a diagram graphically illustrating a comparison of simulation results for $Q_p$ values of configurations of the BAW resonator 34 of FIG. 7 and the BAW resonator 38 of FIG. 8. In the simulations, overall $Q_p$ values were collected for structures configured as transmitter (TX) resonators for operation at LTE Band 7. For the BAW resonator 34 of FIG. 7, a height of the BO ring 30 was set at 60 nm. For the BAW resonator 38 of FIG. 8, a height of the thickest portion of the BO ring 40 was set at 300 nm. A width of the BO rings 30, 40 for both BAW resonators 34, 38 was varied in a range from 0.2 μm to 4 μm as illustrated by the x-axis of FIG. 10A. As illustrated, a width value of 2.6 μm provides a highest $Q_p$ value for the BAW resonator 38, which is higher than any of the $Q_p$ values for the BAW resonator 34.

Figure 10B:
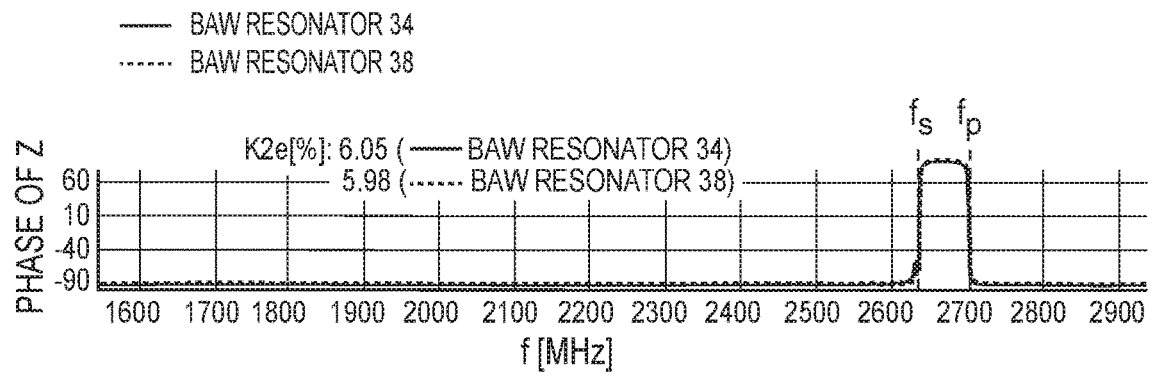
FIGS. 10B-10D are diagrams graphically comparing various performance characteristics for the same BAW resonators as the diagram of FIG. 10A.
Figure 10C:
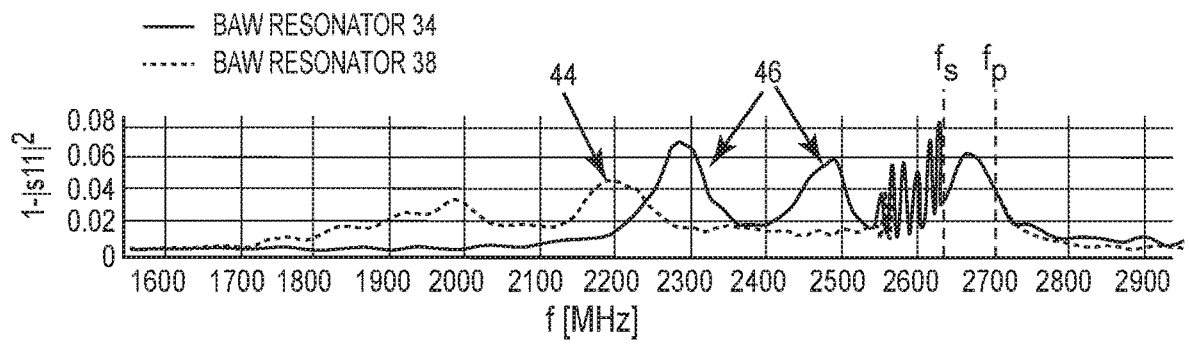
Figure 10D:
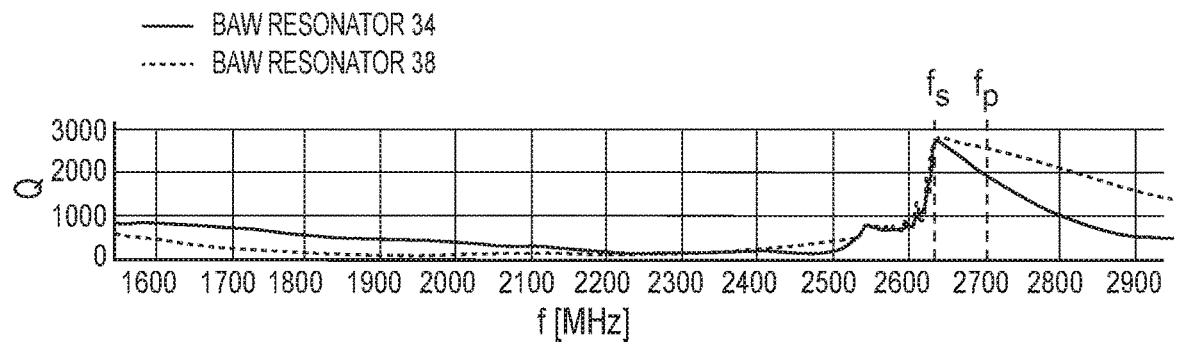

FIGS. 10B-10D are diagrams graphically comparing various performance characteristics for the BAW resonators 34, 38 of FIG. 10A. In FIG. 10B, the phase Z of the BAW resonators 34, 38 is plotted by frequency in megahertz (MHz). Additionally, there is minimal difference in the effective electromechanical coupling factor (K2e in %) between the BAW resonators 34, 38. In FIG. 10C, the y-axis represents the relationship of scattering parameter S11 of 1−(S11)². BO modes 44, 46 are shown with various peaks below the series resonance frequency ($f_s$). Notably, the BO modes 44 for the BAW resonator 38 are weaker and shifted farther away from the series resonance frequency ($f_s$) compared with the BO modes 46 of the BAW resonator 34. In particular, the highest magnitude BO mode 44 for the BAW resonator 38 is shifted at least 400 MHz away from the series resonance frequency ($f_s$). Spurious modes that are visible just below the series resonance frequency ($f_s$) may be suppressed with apodization structures or by adding recessed or mass-reducing structures to the top electrode. FIG. 10D graphically compares the overall Q value for each of the BAW resonators 34, 38. As illustrated, the Q value is consistently higher for the BAW resonators 38 between the series resonance frequency ($f_s$) and the parallel resonance frequency ($f_p$), with notable improvement at $Q_p$.

Figure 11:
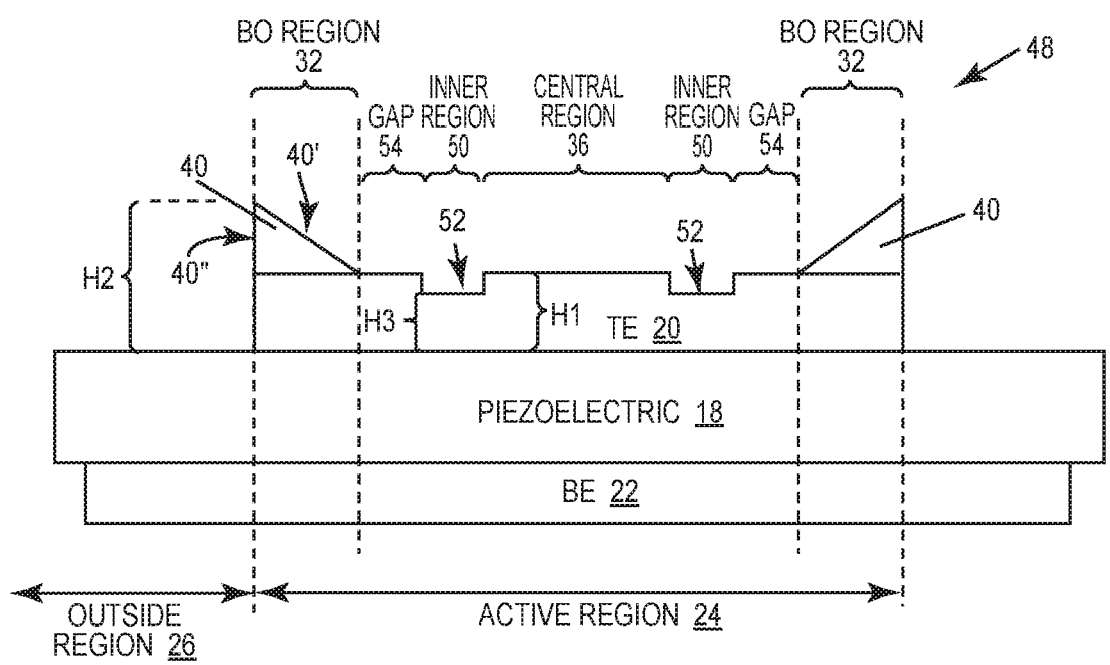
FIG. 11 is a cross-sectional diagram illustrating a BAW resonator where an inner region of the top electrode is arranged with a mass-reducing region according to embodiments disclosed herein.

FIG. 11 is a cross-sectional diagram illustrating a BAW resonator 48 where an inner region 50 of the top electrode 20 is arranged with a mass-reducing region according to embodiments disclosed herein. For illustrative purposes, FIG. 11 is not necessarily drawn to scale, and it is understood the BAW resonator 48 may include many of the same components as the BAW resonator 10 of FIG. 4. The BAW resonator includes the bottom electrode 22, the piezoelectric layer 18, and the top electrode 20 as previously described. In particular, the BO region 32 includes the BO ring 40 with a sloped or graded top surface 40'. The top electrode 20 additionally includes an inner ring 52 formed at the inner region 50 that peripherally bounds the central region 36. The inner ring 52 is a portion of the top electrode 20 where mass has been reduced. In this regard, the inner ring 52 forms a third height H3 from the piezoelectric layer 18 that is less than the first height H1 of the central region 36 and less than the second height H2 at the lateral edge 40" of the BO ring 40. As depicted in FIG. 11, the inner ring 52 may be formed by a channel being recessed into the top electrode 20. Alternatively, the inner ring 52 may be formed at the same time as when the top electrode 20 is formed. In certain embodiments, the inner ring 52 (and the inner region 50) may be spaced apart from the BO region 32 and the BO ring 40 by a gap 54 or a gap region or portion of the top electrode 20. In certain embodiments, the presence of the gap 54 may allow formation of a deeper inner ring 52, and thus, better manufacturing control of its depth. In other embodiments, the gap 54 may be omitted and as such the inner ring 52 is arranged directly adjacent to the BO region 32. In certain embodiments, the BO ring 40, the gap 54, and the inner ring 52 may be arranged to form a descending structure from the lateral edge 40" toward the central region 36 that includes a graded or sloped portion and a stepped portion. By providing the inner ring 52 as a mass-reducing region, spurious modes below the series resonance frequency ($f_s$) may be suppressed with significantly improved performance. In certain embodiments, apodization may be used in combination with the inner ring 52.

Figure 12:
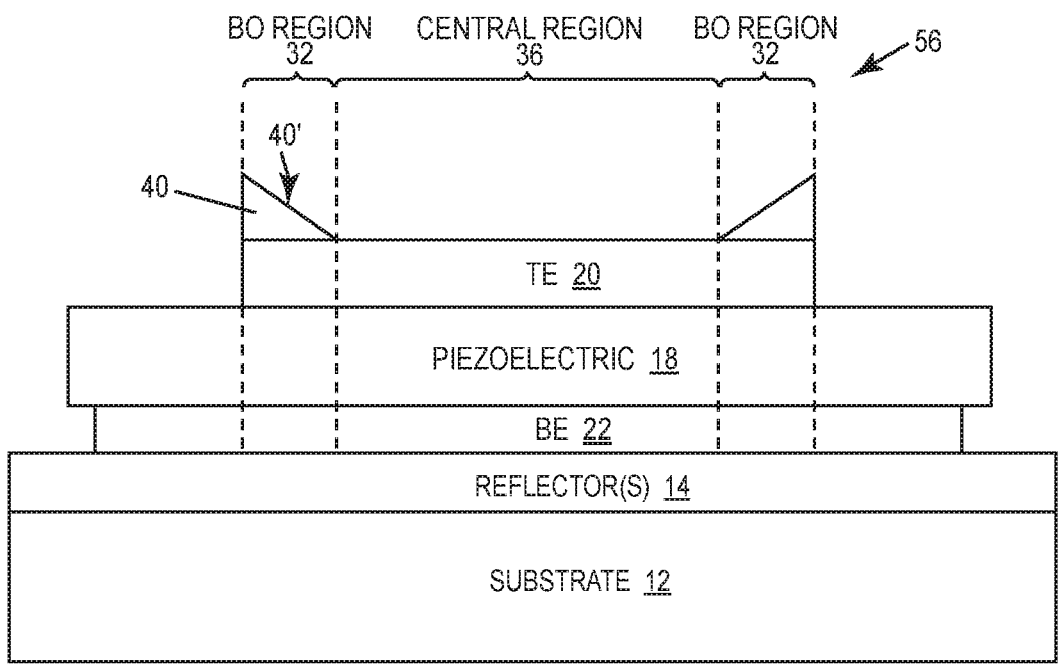
FIG. 12 is a cross-sectional diagram illustrating an exemplary solidly mounted resonator (SMR) type BAW resonator according to embodiments disclosed herein.
Figure 13:
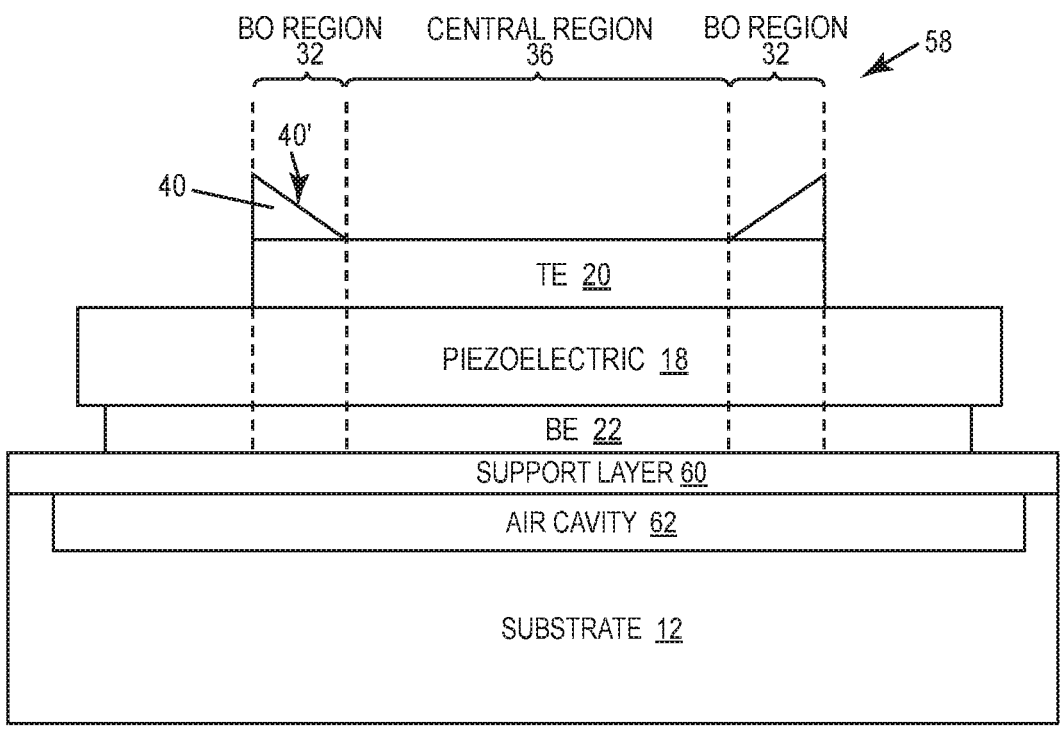
FIG. 13 is a cross-sectional diagram illustrating an exemplary film bulk acoustic resonator (FBAR) type BAW resonator according to embodiments disclosed herein.

Embodiments as described herein may be well suited for different arrangements of BAW resonators, including SMR and FBAR type BAW resonators. In particular, any of the various features and elements as disclosed above may provide improved performance for both SMR and FBAR type BAW structures. FIGS. 12 and 13 are provided to respectively illustrate exemplary SMR and FBAR structures.

FIG. 12 is a cross-sectional diagram illustrating an exemplary SMR type BAW resonator 56 according to embodiments disclosed herein. The BAW resonator 56 includes the bottom electrode 22, the piezoelectric layer 18, and the top electrode 20 as previously described. As illustrated, the BO region 32 may include the BO ring 40 with the graded or sloped top surface 40' as previously described, where the BO region 32 laterally bounds the central region 36. Additionally, the BAW resonator 56 may include one or more reflectors 14 and the substrate 12 as described for FIG. 4 to form the SMR structure.

FIG. 13 is a cross-sectional diagram illustrating an exemplary FBAR type BAW resonator 58 according to embodiments disclosed herein. The BAW resonator 58 may include the bottom electrode 22, the piezoelectric layer 18, the top electrode 20, the BO ring 40 with the graded or sloped top surface 40', and the central region 36 as previously described. Additionally, the BAW resonator 58 may include a support layer 60 over the substrate 12, with an air cavity 62 arranged therebetween to form the FBAR structure.

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) resonator comprising:
   a bottom electrode;
   a piezoelectric layer over the bottom electrode; and
   a top electrode over the piezoelectric layer, the top electrode forming a border (BO) ring that extends about a periphery of a central region of the top electrode, and a top surface of the BO ring forms a height from the piezoelectric layer that is continuously graded in a descending and linear manner from a lateral edge of the BO ring and the top surface of the BO ring intersects with a planar top surface of the top electrode in the central region.

2. The BAW resonator of claim 1, wherein an active region is formed where the top electrode overlaps with the bottom electrode on opposing faces of the piezoelectric layer, an outside region is formed outside of the active region, and the lateral edge of the BO ring is arranged closer to the outside region than other portions of the BO ring.

3. The BAW resonator of claim 1, wherein a width of the top surface of the BO ring is in a range from 0.2 microns ($\mu$m) to 4 $\mu$m.

4. The BAW resonator of claim 1, wherein the top surface of the BO ring forms an angle of at least 165 degrees from the planar top surface of the top electrode in the central region.

5. The BAW resonator of claim 1, wherein the top surface of the BO ring forms an angle in a range including 165 degrees to 175 degrees from the planar top surface of the top electrode in the central region.

6. The BAW resonator of claim 1, wherein a height of the lateral edge of the BO ring is in a range including 200 nanometers to 400 nanometers.

7. The BAW resonator of claim 1, wherein a cross-section of the BO ring forms a triangular shape.

8. The BAW resonator of claim 1, wherein the BO ring forms a raised frame about a periphery of the top electrode.

9. The BAW resonator of claim 1, wherein the BO ring is an integral continuous portion of the top electrode.

10. The BAW resonator of claim 1, wherein the bottom electrode comprises a larger lateral dimension along the piezoelectric layer than the top electrode.

11. The BAW resonator of claim 1, wherein the top electrode forms an inner ring that is a mass-reducing region of the top electrode.

12. The BAW resonator of claim 11, wherein the inner ring is spaced apart from the BO ring by a gap portion of the top electrode.

13. The BAW resonator of claim 1, wherein the BAW resonator comprises a solidly mounted resonator (SMR) type BAW resonator.

14. The BAW resonator of claim 1, wherein the BAW resonator comprises a film bulk acoustic resonator (FBAR).

15. A bulk acoustic wave (BAW) resonator comprising:
    a bottom electrode;
    a piezoelectric layer over the bottom electrode;
    a top electrode over the piezoelectric layer; and
    a border (BO) ring that extends about a periphery of a central region of the top electrode, and a top surface of the BO ring forms a height from the piezoelectric layer that is continuously graded in a descending and linear manner from a lateral edge of the BO ring and the top surface of the BO ring intersects with a planar top surface of the top electrode in the central region.

16. The BAW resonator of claim 15, wherein the BO ring comprises an additional material formed on the top electrode.

17. The BAW resonator of claim 16, wherein the additional material comprises a same material as the top electrode.

18. The BAW resonator of claim 16, wherein the additional material comprises a different material than the top electrode.

19. The BAW resonator of claim 15, wherein the BO ring forms a raised frame about a periphery of the top electrode.

20. The BAW resonator of claim 15, wherein a width of the top surface of the BO ring is in a range from 0.2 microns ($\mu$m) to 4 $\mu$m.

21. The BAW resonator of claim 15, wherein the bottom electrode comprises a larger lateral dimension along the piezoelectric layer than the top electrode.

22. The BAW resonator of claim 15, wherein the top electrode forms an inner ring that is a mass-reducing region of the top electrode.

23. The BAW resonator of claim 22, wherein the inner ring is spaced apart from the BO ring by a gap portion of the top electrode.

24. The BAW resonator of claim 15, wherein the BAW resonator comprises a solidly mounted resonator (SMR) type BAW resonator.

25. The BAW resonator of claim 15, wherein the BAW resonator comprises a film bulk acoustic resonator (FBAR).

* * * * *